(12) United States Patent
Terui et al.

(10) Patent No.: US 7,969,080 B2
(45) Date of Patent: Jun. 28, 2011

(54) ELECTRON SOURCE

(75) Inventors: Yoshinori Terui, Shibukawa (JP); Seiichi Sakawa, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 171 days.

(21) Appl. No.: 12/439,413

(22) PCT Filed: Aug. 31, 2007

(86) PCT No.: PCT/JP2007/067008
§ 371 (c)(1),
(2), (4) Date: Feb. 27, 2009

(87) PCT Pub. No.: WO2008/029731
PCT Pub. Date: Mar. 13, 2008

(65) Prior Publication Data
US 2010/0019649 A1     Jan. 28, 2010

(30) Foreign Application Priority Data

Sep. 5, 2006  (JP) ................................ 2006-240100

(51) Int. Cl.
*H01J 1/00* (2006.01)
(52) U.S. Cl. ....................................... 313/326; 313/310
(58) Field of Classification Search .......... 313/483–493, 313/623, 627–643, 567, 111–117, 25–27, 313/310–357, 446; 439/615, 739; 445/24, 445/26, 29, 22
See application file for complete search history.

(56) References Cited

U.S. PATENT DOCUMENTS

| | | | |
|---|---|---|---|
| 5,831,379 A | 11/1998 | Jeong et al. | |
| 6,680,562 B1 * | 1/2004 | McGinn et al. | 313/326 |
| 2006/0226753 A1 * | 10/2006 | Adamec et al. | 313/310 |

FOREIGN PATENT DOCUMENTS

| | | |
|---|---|---|
| DE | 100 29 840 A1 | 1/2001 |
| JP | 7 85775 | 3/1995 |
| JP | 2001 52596 | 2/2001 |
| JP | 2003 507872 | 2/2003 |
| JP | 2006 269431 | 10/2006 |
| WO | WO 01/15192 A1 | 3/2001 |

OTHER PUBLICATIONS

D. Tuggle, et al., "Application of a Thermal Field Emission Source for High Resolution, High Current e-Beam Microprobes", J. Vac. Sci. Technol. 16 (6), Nov./Dec. 1979, p. 1699.

M.J. Fransen, "On the Electron-Optical Properties of the ZrO/W Schottky Electron Emitter", Advances In Imaging and Electron Physics, vol. III, 1999 by Academic Press., pp. 91-166.

* cited by examiner

*Primary Examiner* — Nimeshkumar D. Patel
*Assistant Examiner* — Donald L Raleigh
(74) *Attorney, Agent, or Firm* — Oblon, Spivak, McClelland, Maier & Neustadt, L.L.P.

(57) ABSTRACT

The present invention provides an electron source that can produce a stable electron beam even if an apparatus employing the electron source receives vibration from the outside. An electron source comprising an insulator, a pair of conductive terminals attached to the insulator, a filament tensed between the pair of conductive terminals, a rod-shaped cathode having a sharp end portion performing as an electron emitting portion and joined with the filament, wherein the cathode has another end portion different from the electron emitting portion, fixed to the insulator. It is preferred that said another end portion of the cathode other than the electron emitting portion, is fixed to the insulator via a metal pin brazed with the insulator.

18 Claims, 2 Drawing Sheets

ELECTRON SOURCE

CROSS REFERENCE TO RELATED APPLICATION

This application is a 371 of PCT/JP07/067,008, filed on Aug. 31, 2007, and claims priority to Japanese Patent Application No. 2006-240100, filed on Sep. 5, 2006.

TECHNICAL FIELD

The present invention relates to an electron source for e.g. a scanning electron microscope (hereinafter referred to as SEM), an Auger electron spectroscope, an electron beam lithography machine or a wafer inspection apparatus.

BACKGROUND ART

In recent years, in order to obtain an electron beam having higher brightness and longer operating life than a thermionic cathode, an electron source (hereinafter referred to as a ZrO/W electron source) employing a cathode made of a needle electrode of tungsten single crystal provided with a covering layer comprising zirconium and oxygen, has been used (Non-Patent Document 1).

The ZrO/W electron source is one wherein a diffusing source made of zirconium oxide is provided on a needle cathode of tungsten single crystal having an axial orientation being <100> orientation, so that zirconium and oxygen are diffused to form a covering layer (hereinafter referred to as a ZrO covering layer) so as to reduce the work function of the (100) crystallographic plane of tungsten single crystal to a level of from 4.5 eV to 2.8 eV. In this ZrO/W electron source, only the very small crystallographic facet corresponding to the (100) crystallographic plane formed at the forward end of the cathode becomes an electron emission area, whereby an electron beam having a higher brightness than by a conventional thermionic cathode can be obtained, and yet this electron source has such a characteristic that it has a longer operating life. Further, such an electron source has characteristics such that it is more stable than a cold field emission electron source and is operable even under a low vacuum degree and thus easy to use (Non-Patent Document 2).

As shown in FIG. 1, in the ZrO/W electron source, a needle cathode 1 of tungsten having <100> orientation which emits an electron beam, is fixed by e.g. welding to a predetermined position of a tungsten filament 3 provided on conductive terminals 4 fixed to an insulator 5. A zirconium- and oxygen-diffusing source 2 is formed at a portion of the cathode 1. Although not shown in the drawings, the surface of the cathode 1 is covered with a ZrO covering layer.

The cathode 1 is Joule heated by the filament 3 and used usually at a temperature of about 1,800 K. Accordingly, the ZrO covering layer on the surface of the cathode 1 will be lost by evaporation. However, from the diffusing source 2, zirconium and oxygen will diffuse and will be continuously supplied to the surface of the cathode 1, and consequently, the ZrO covering layer will be maintained.

When the ZrO/W electron source is used, the forward end of the cathode 1 is disposed between a suppressor electrode and an extractor electrode. To the cathode 1, a high voltage negative against the extractor electrode is applied, and to the suppressor electrode, a negative voltage at a level of a few hundred volts against the cathode 1 is applied to suppress thermionic electrons from the filament 3.

In a CD-SEM or a wafer inspection apparatus to be used at a low accelerating voltage, the ZrO/W electron source is operated at an angular intensity of from 0.1 to 0.2 mA/sr and shows the probe current and suppressed spread of energy width. For this reason, the ZrO/W electron source is widely used as an electron source enabling to obtain high-resolution SEM images.

Non-Patent Document 1: D. Tuggle, J. Vac. Sci. Technol. 16, p 1699 (1979)

Non-Patent Document 2: M. J. Fransen, "On the Electron-Optical Properties of the ZrO/W Schottky Electron Emitter", ADVANCES IN IMAGING AND ELECTRON PHYSICS, VOL. III, p 91-166, 1999 by Academic Press.

DISCLOSURE OF THE INVENTION

Problems to be Solved by the Invention

Heretofore, when a SEM image is observed at a relatively high magnification by a scanning electron microscope, environmental vibration propagated to the apparatus causes a noise, which deteriorates the resolution and prevents to carry out e.g. CD measurement in some cases. This noise is known to be caused by vibration of a tungsten filament of a ZrO/W electron source at a resonance frequency.

In order to suppress the vibration due to electron source, a measure of providing a vibration-isolating structure outside the apparatus has been attempted, but there is a problem that in order to completely prevent the resonation, the apparatus becomes complicated. Namely, it is an object of the present invention to provide a light source producing stable electron beam even if an apparatus employing the electron source receives a vibration from the outside.

Means of Solving the Problems

The gist of the present invention lies in the following constructions.

(1) An electron source comprising an insulator, a pair of conductive terminals attached to the insulator, a filament tensed between the pair of conductive terminals, a rod-shaped cathode having a sharp end portion performing as an electron emitting portion and joined with the filament, wherein the cathode has another end portion different from the electron emitting portion, fixed to the insulator.

(2) The electron source according to the above (1), wherein said another end portion of the cathode other than the electron emitting portion, is fixed to the insulator via a metal pin brazed with the insulator.

(3) The electron source according to the above (2), wherein said another end portion of the cathode different from the electron emitting portion, is fixed to the metal pin by welding.

(4) The electron source according to any one of the above (1) to (3), wherein the cathode consists of a single crystal of molybdenum or tungsten having a <100> orientation, and a portion of the cathode contains as a diffusion source an oxide of an element selected form the group consisting of zirconium, hafnium, titanium, scandium, yttrium and barium.

(5) The electron source according to the above (4), which comprises as a light source an oxide of zirconium.

(6) The electron source according to the above (4) or (5), wherein the cathode consists of tungsten.

(7) The electron source according to any one of the above (1) to (6), wherein the filament consists of tungsten or a tungsten alloy.

(8) An electron beam-utilizing apparatus employing the electron source as defined in any one of the above (1) to (7).

Effects of the Invention

The electron source of the present invention has a construction in which a hair-pin-shaped filament is joined with a rod-shaped cathode having a sharp electron emitting portion, and another end portion of the cathode different from the electron emitting portion is fixed to an insulator. Accordingly, when the electron source is employed for practical use, it is possible to prevent generation of noise due to resonation of the electron source caused by an environmental vibration, and accordingly, it is possible to obtain an effect that it is possible to provide an electron beam achieving high resolution even in a case of e.g. observing a SEM image at high magnification.

Figure 1:
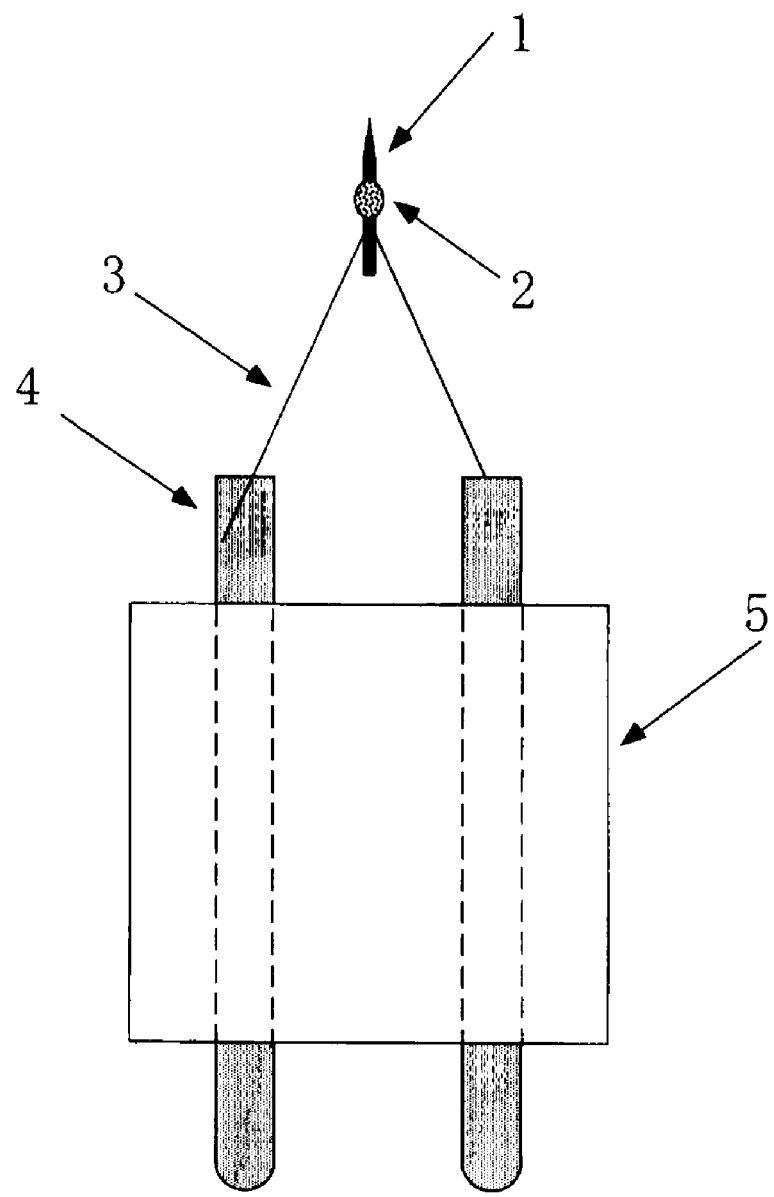
FIG. 1: A structural view of a known electron source according to a Comparative Example.

| MEANINGS OF NUMERALS | |
|---|---|
| 1: | Cathode |
| 2: | Diffusingsource |
| 3: | Filament |
| 4: | Conductive terminal |
| 5: | Insulator |
| 6: | Metal pin |
| 7: | End portion of cathode different from electron emitting portion |

BEST MODE FOR CARRYING OUT THE INVENTION

The electron source of the present invention has a special construction in which a rod-shaped cathode has a sharp electron emitting portion and another end portion different from the electron emitting portion is fixed to an insulator as described above, whereby the electron source is not susceptible to vibration propagated from outside, and has a characteristic that it can provide stable electron beam. Accordingly, the electron source of the present invention is applicable to an electron beam-utilizing apparatus such as a scanning electron microscope, an Auger electron spectroscope, an electron beam lithography machine or a wafer inspection apparatus. In the following, the present invention will be described by using an electron-emitting cathode to be used for e.g. an electron microscope, an electron beam lithography machine or a CD SEM as an example, but the present invention is not limited to such a cathode.

Namely, the cathode in the electron source of the present invention consists of a single crystal of molybdenum or tungsten having a <100> orientation, and a part of the cathode contains as a diffusion source, an oxide of an element selected from the group consisting of zirconium, hafnium, titanium, scandium, yttrium and barium.

In the electron source of the present invention, the material of cathode (it may be referred to as a chip in the present invention) is preferably tungsten. Further, it is particularly preferred that a part of the cathode contains an oxide of zirconium as a diffusion source. Further, the cathode has a rod shape having e.g. a circular, an elliptical or a rectangular cross section, and the diameter (a diameter of corresponding circle when the cross section is not circular) of the cross section is preferably from 0.05 to 0.5 mm and the length is preferably from 1 to 10 mm.

The material of the filament may, for example, be tungsten, molybdenum or tantalum, and among these, the material is preferably tungsten or an alloy containing tungsten, particularly preferably tungsten. The filament is preferably made of a rigid needle, the diameter of its cross section is preferably from 0.05 to 0.5 mm, and its length is preferably from 0.3 to 0.8 cm in terms of the length between the cathode and an insulator. The filament preferably has a hair pin shape.

The material of the insulator of the present invention may, for example, be an alumina, a zirconia or a mica ceramics, and among these, it is preferably an alumina. The insulator preferably has a cylindrical shape having, for example, a diameter of from 0.5 to 2.0 cm and a height of from 0.5 to 2.0 cm. Further, the material of the conductive terminals attached to the insulator may, for example, be a Fe—Ni—Co alloy or titanium, and among these, it is preferably a Fe—Ni—Co alloy. Further, the conductive terminals each has a rod shape, its cross section has a diameter (a diameter of a corresponding circle when the cross section is not circular) of preferably from 0.05 to 0.5 cm, and its length is preferably from 0.2 to 2.0 cm.

In the present invention, the material of the metal pin for fixing the filament to the above insulator may, for example, be a Fe—Ni—Co alloy or titanium, and among these, it is preferably a Fe—Ni—Co alloy. Further, the metal pin has a rod shape, and the diameter (a diameter of a corresponding circle when the diameter is not circular) of the cross section is preferably from 0.05 to 0.5 cm, and its length is preferably from 0.2 to 2.0 cm. Further, the brazing material at a time of brazing the metal pin to the insulator is preferably a silver brazing.

Figure 2:
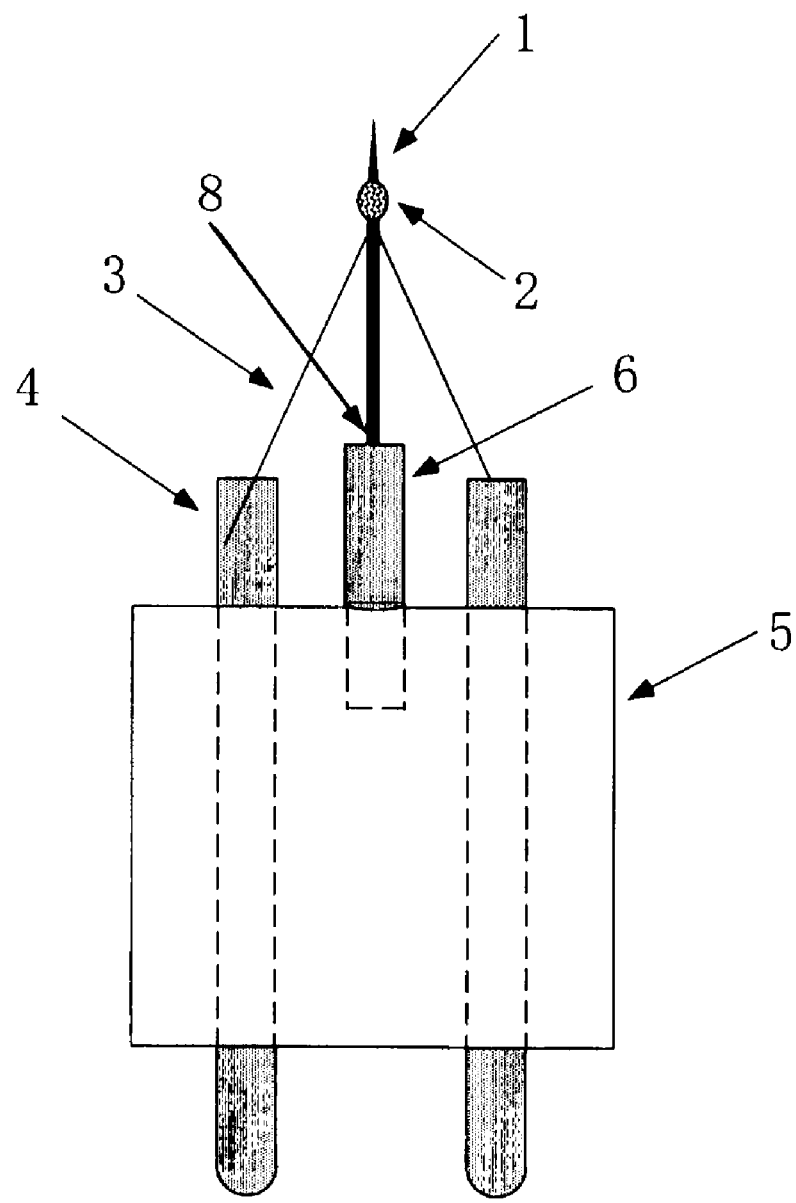
FIG. 2: A structural view of an example of an electron source according to the present invention.

Now, specific embodiments of the electron source of the present invention will be described with reference to FIG. 2.

To conductive terminals 4 fixed to an insulator 5, a hair pin type filament 3 being a wire made of tungsten or a tungsten alloy is welded. Next, to a predetermined position of the filament 3, a needle shaped cathode 1 made of a single crystal of tungsten having a <100> orientation for emitting an electron beam is joined by e.g. welding to be fixed. In this case, the position of the hair pin type filament 3 to which the cathode 1 is joined is preferably a hair pin portion.

Further, in the present invention, an end portion 8 of the cathode 1 different from the electron emitting portion joined with the filament 3, that is the end portion 8 on the opposite side, is fixed to the insulator 5. Thus, by employing a structure in which the end portion 8 of the cathode 1 different from the electron emitting portion is fixed to the insulator 5, it is possible to suppress generation of noise due to resonation of the cathode caused by environmental vibration to an extremely low level. As a result, an apparatus employing the electron source of the present invention realizes significant effects that are achievement of high resolution without providing e.g. a vibration isolation structure outside the apparatus, and achievement of high reliability at low cost.

As means for fixing the end portion 8 of the cathode 1 different from the electron emitting portion to the insulator 5, a method of embedding a metal pin 6 in the insulator 5 and fixing the embedded portion by means of e.g. brazing, and fixing the cathode 1 to the metal pin 6 by e.g. welding, is preferred for the reason that the cathode 1 can be fixed to the insulator 5 simply and securely. In this case, by employing a metal pin having a diameter of from 0.5 to 5 mm and fixing it to the insulator 5, it is possible to fix the cathode 1 at one location in the central portion of the insulator 5 sufficiently, by means of the metal pin 6 as shown in FIG. 2.

Next, the leading edge portion of the cathode 1 forming the electron emitting portion is sharpened by electrolytic polishing, and a diffusion source 2 such as a zirconium source is formed in a side face in the central portion of the cathode 1, and subsequently, the cathode 1 is subjected to a treatment of heating in the presence of oxygen of preferably about $10^{-4}$ Pa to diffuse the zirconium and oxygen to the leading edge portion of the cathode 1 (hereinafter referred to as oxygen treatment).

Thereafter, e.g. a lead-out electrode is attached to a front face of the cathode 1, and a voltage is applied between the lead-out electrode and the cathode 1 in a vacuum environment of preferably about $10^{-7}$ Pa, to form an electron emitting portion having a <100> crystal face in the leading edge portion of the cathode 1. In the above step, the cathode 1 may be joined with the filament 3 after the leading edge portion of the cathode 1 forming the electron emitting portion is sharpened in advance.

EXAMPLES

The present invention will be specifically described with reference to the Example and the Comparative Example below, but it is a matter of course that the present invention is not limited to such an Example.

Example

To a pair of conductive terminals brazed to an insulator, a filament made of tungsten is fixed by spot welding. Then, a single crystal tungsten cathode of <100> orientation was fixed to the filament by spot welding. Further, an end portion of the cathode attached to the filament different from the electron emitting portion was spot-welded to a metal pin brazed to the central portion of the insulator.

Subsequently, the leading edge portion of the cathode was sharpened by electrolytic polishing. Next, hydrogenated zirconium was pulverized and blended with isoamyl acetate to prepare a paste-form material, and the paste-form material was applied to a part of the cathode to form a diffusion source, and thereafter, it was heated under the presence of oxygen of about $10^{-4}$ Pa to carry out an oxygen treatment to obtain an electron source having a structure shown in FIG. 2.

This electron source was put in a sample chamber of SEM, it was positioned so that the axial direction of the cathode agrees with a scanning direction, and its position was adjusted so that a SEM image of a side face of the cathode in the vicinity of its leading edge can be observed in a monitor. A speaker provided with a software (test tone generator) capable of sweeping the frequency within an optional range and at optional mode and speed as a sound source, and the speaker was connected with a PC (personal computer). Then, the speaker was fixed at predetermined position and direction in the vicinity of the outside of the sample chamber containing the cathode (electron source) prepared in the above.

The magnification of the SEM was set to be $5\times10^4$X, and the image operation time in the monitor was set to be 80 sec. Further, the sound generation conditions were set so that the frequency range was from 1,000 to 4,000 Hz, and the frequency was swept linearly in 80 sec in the range. The image moves laterally at a frequency corresponding to a resonance frequency during the sweeping, and twice of the movement amount was defined as the amplitude in this condition.

Comparative Example

With respect to an electron source of conventional structure shown in FIG. 1, that is an electron source prepared in the same manner as the above Example 1 except that the cathode was not spot-welded to a metal pin, a resonance test was carried out in the same manner as the above Example.

Table 1 shows the results of the Example and the Comparative Example each tested at n=3. It is confirmed from Table 3 that although the resonance frequencies are approximately the same, the amplitudes in the Example were significantly suppressed.

TABLE 1

|  | n | Resonance frequency (Hz) | Amplitude (μm) |
|---|---|---|---|
| Example | 1 | 2748 | 0.2 |
|  | 2 | 2850 | 0.4 |
|  | 3 | 2796 | 0.3 |
| Comparative Example | 1 | 2750 | 2.5 |
|  | 2 | 2706 | 3.2 |
|  | 3 | 2782 | 2.7 |

INDUSTRIAL APPLICABILITY

The electron source of the present invention has a special structure reducing susceptibility to environmental vibration, and it has a characteristic that it can produce stable electron beam. Accordingly, the electron source is usable in various types of electron beam-utilizing apparatuses such as a scanning electron microscope, an Auger electron spectroscope, an electron beam lithography machine or a wafer inspection apparatus, and is extremely useful for industrial use.

The entire disclosure of Japanese Patent Application No. 2006-240100 filed on Sep. 5, 2006 including specification, claims, drawings and summary is incorporated herein by reference in its entirety.

The invention claimed is:

1. An electron source comprising
an insulator,
a pair of conductive terminals attached to the insulator,
a filament tensed between the pair of conductive terminals,
a cathode, in the form of a rod, having a sharp end portion performing as an electron emitting portion and joined with the filament, and
a metal pin present in the insulator, where a part of the metal pin protrudes from a surface of the insulator to expose a surface of the metal pin,
wherein
an opposite end portion of the cathode, different from the electron emitting portion, is in contact with the exposed surface of the metal pin, and
the cathode has another end portion different from the electron emitting portion, fixed to the insulator.

2. The electron source according to claim 1, wherein said metal pin is brazed with the insulator.

3. The electron source according to claim 1, wherein said opposite end portion of the cathode is fixed to the metal pin by welding.

4. The electron source according to claim 1, wherein the cathode comprises a single crystal of molybdenum or tungsten having a <100> orientation, and a portion of the cathode comprises as a diffusion source an oxide of an element selected from the group consisting of zirconium, hafnium, titanium, scandium, yttrium and barium.

5. The electron source according to claim 4, which comprises as a diffusion source an oxide of zirconium.

6. The electron source according to claim 4, wherein the cathode comprises tungsten.

7. The electron source according to claim 1, wherein the filament comprises tungsten or a tungsten alloy.

8. An electron beam-utilizing apparatus employing the electron source as defined in claim 1.

9. The electron source according to claim 1, wherein the cathode consists of a single crystal of molybdenum or tungsten having a <100> orientation, and a portion of the cathode contains as a diffusion source an oxide of an element selected from the group consisting of zirconium, hafnium, titanium, scandium, yttrium and barium.

10. The electron source according to claim 4, wherein the cathode consists of tungsten.

11. The electron source according to claim 1, wherein the filament consists of tungsten or a tungsten alloy.

12. The electron source according to claim 1, wherein the filament comprises tungsten, is in the form of a rigid needle, has a cross section of from 0.05 to 0.5 mm, and has a length of from 0.3 to 0.8 cm in terms of length between the cathode and the insulator.

13. The electron source according to claim 1, wherein the insulator comprises alumina, is in the form of a cylinder having a diameter of from 0.5 to 2.0 cm and a height of from 0.5 to 2.0 cm.

14. The electron source according to claim 1, wherein the metal pin comprises an Fe—Ni—Co alloy or titanium, and the rod has a diameter of the cross section of from 0.05 to 0.5 cm and a length of from 0.2 to 2.0 cm.

15. The electron source according to claim 14, wherein the diameter of the cross section is from 0.5 to 5 mm.

16. The electron source according to claim 2, wherein a brazing is a silver brazing.

17. The electron source according to claim 1, having a vibrational amplitude of from 0.2 to 0.4 μm at the first three resonance frequencies of 2748, 2850 and 2796 Hz.

18. The electron source according to claim 1, wherein the opposite end portion of the cathode, different from the electron emitting portion, is spot-welded to the insulator.

* * * * *